United States Patent
Bullivant et al.

[11] Patent Number: 5,944,535
[45] Date of Patent: Aug. 31, 1999

[54] INTERFACE PANEL SYSTEM FOR NETWORKS

[75] Inventors: Todd J. Bullivant, Stonington; Michael R. O'Connor, Seymour, both of Conn.

[73] Assignee: Hubbell Incorporated, Orange, Conn.

[21] Appl. No.: 08/795,396

[22] Filed: Feb. 4, 1997

[51] Int. Cl.[6] .................................................. H04M 1/00
[52] U.S. Cl. ............................................ 439/49; 379/327
[58] Field of Search ........................... 439/49, 540.1, 439/532, 502; 379/325, 326, 327

[56] References Cited

U.S. PATENT DOCUMENTS

| | | | |
|---|---|---|---|
| 2,943,272 | 6/1960 | Feldman | 333/12 |
| 3,496,555 | 2/1970 | Jones | 340/174 |
| 3,757,028 | 9/1973 | Schessel | 174/33 |
| 3,761,842 | 9/1973 | Gandrud | 333/1 |
| 3,891,815 | 6/1975 | Hiele | 335/152 |
| 4,367,908 | 1/1983 | Johnston | 439/676 |
| 4,413,469 | 11/1983 | Paquin | 57/273 |
| 4,481,379 | 11/1984 | Bolick | 174/117 |
| 4,689,441 | 8/1987 | Dick | 174/68.5 |
| 4,767,338 | 8/1988 | Dennis et al. | 439/55 |
| 4,773,867 | 9/1988 | Keller et al. | 439/532 |
| 4,785,135 | 11/1988 | Ecker | 174/34 |
| 4,829,564 | 5/1989 | Jarvis | 379/327 |
| 4,831,497 | 5/1989 | Webster | 361/406 |
| 4,850,887 | 7/1989 | Sugawara | 439/108 |
| 5,027,088 | 6/1991 | Shimizu | 333/1 |
| 5,039,824 | 8/1991 | Takashima | 174/33 |
| 5,124,567 | 6/1992 | Fujita | 333/12 |
| 5,167,530 | 12/1992 | Wallgren | 439/540.1 |
| 5,186,647 | 2/1993 | Denkmann | 437/395 |
| 5,226,835 | 7/1993 | Baker | 439/403 |
| 5,269,708 | 12/1993 | DeYoung | 439/676 |
| 5,295,869 | 3/1994 | Siemon | 439/620 |
| 5,299,956 | 4/1994 | Brownell | 439/676 |
| 5,414,393 | 5/1995 | Rose et al. | 333/1 |
| 5,432,484 | 7/1995 | Klas et al. | 333/1 |
| 5,531,611 | 7/1996 | Reed | 439/540.1 |
| 5,658,166 | 8/1997 | Freeman et al. | 439/540.1 |

FOREIGN PATENT DOCUMENTS

| | | |
|---|---|---|
| 0525703 | 2/1983 | European Pat. Off. . |
| 0268484 | 11/1990 | Japan . |
| 1382013 | 1/1975 | United Kingdom . |
| 1440392 | 6/1976 | United Kingdom . |
| 1449209 | 9/1976 | United Kingdom . |
| 2089122 | 6/1983 | United Kingdom . |
| 2233157 | 1/1991 | United Kingdom . |

OTHER PUBLICATIONS

Hubbell Premise Wiring Full Line Catalog 2200.
Principles of Electricity applied to Telephone and Telegraph Work, American Telephone and Telegraph Co., Jun. 1961.

*Primary Examiner*—Neil Abrams
*Attorney, Agent, or Firm*—Jerry M. Presson; Mark S. Bicks

[57] ABSTRACT

A connection system for a computer network includes a computer terminal (12), wall outlet (16), a patch panel (28), an interface panel (32) and a network hub (36). A terminal jack (14) on the computer terminal and an outlet jack (18) on the wall terminal are connected by a patch cord (20). The patch panel has a plurality of patch modular jacks (40), each of which is connected to an interface modular jack (46) by a patch cord (34). An elongated receptacle (48) is mounted on the interface panel and is connected to the modular jacks of the interface panel by a wiring board (50). The wiring board has conductive paths which connect the terminals of the interface modular jacks with the terminals of the elongated receptacle and cancel crosstalk. The network hub is connected to the interface connector by a patch cord (38).

8 Claims, 4 Drawing Sheets

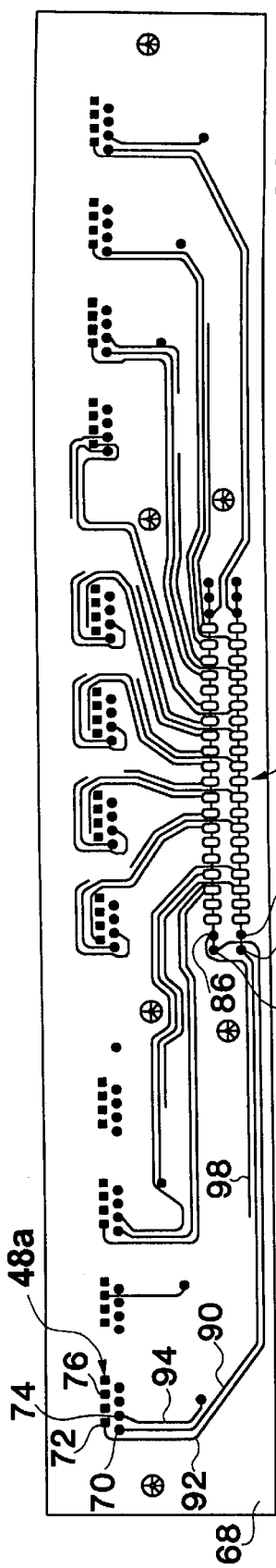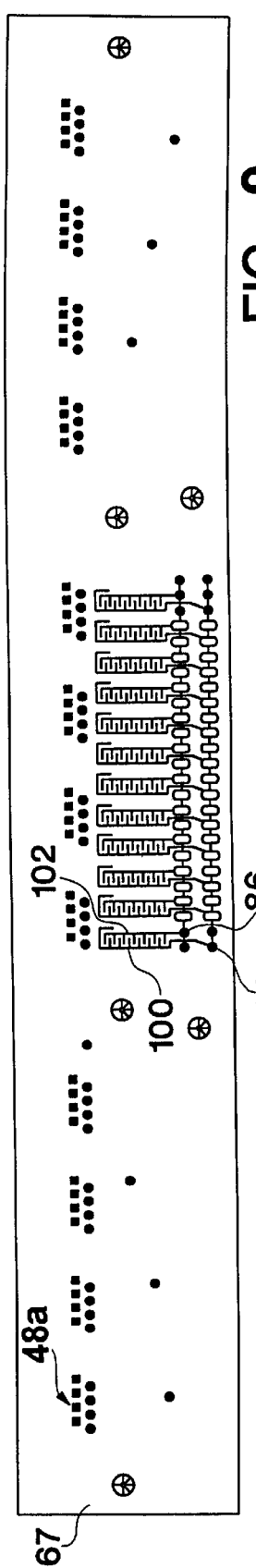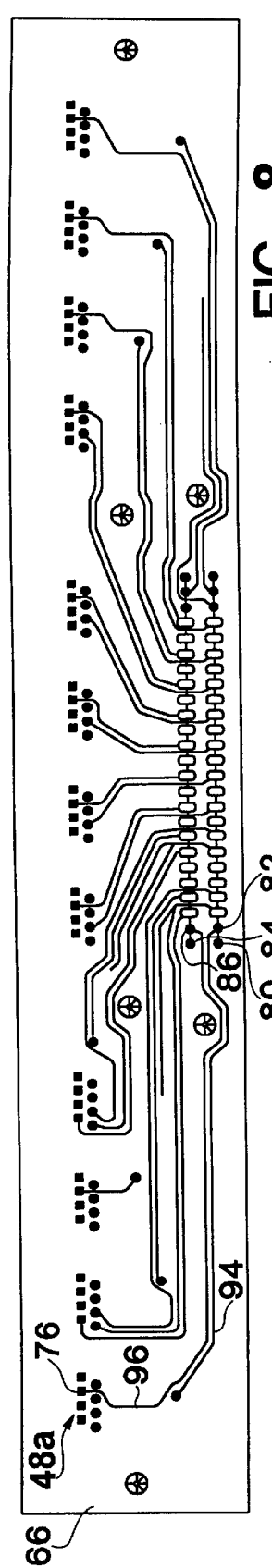

INTERFACE PANEL SYSTEM FOR NETWORKS

REFERENCE TO RELATED APPLICATION

This application is related to U.S. patent application Ser. No. 08/795,394, filed concurrently herewith in the name of Robert A. Aekins and entitled LOW CROSSTALK NOISE CONNECTOR FOR TELECOMMUNICATION SYSTEMS, the subject matter of which is hereby incorporated by reference.

FIELD OF THE INVENTION

The present invention relates to an interface panel and to a connection system for a high speed computer network system. More specifically, the present invention relates to an interface panel having modular jacks and an elongated receptacle mounted on and electrically connected by a printed wiring board, and to a computer network connection system including that interface panel in combination with a wall outlet, a patch panel and a network hub coupled by patch cords.

BACKGROUND OF THE INVENTION

Installation of networks, including Ethernet applications, require manual installation of wiring connecting each computer terminal to the hub. Some installations can require that each wire be individually connected to the respective terminal, for example, by means of a 110 contact.

Additionally, the wiring needs to be made more efficient by increasing the number of ports derived from a single interface on a high speed hub or active component. This increase in number of ports must not detract from the performance characteristics of the system. Due to advancements in telecommunications and data transmission speeds, Category 5 performance must be maintained even at 100 megabits per second throughput.

The connectors, including jacks, patch panels, cross-connects, et cetera, have become a critical impediment to high performance data transmission at these higher speeds. Some performance characteristics, particularly near end crosstalk, degrades beyond acceptable performance levels at these higher speeds.

The problem of crosstalk must be resolved without modifying pre-existing wiring and existing wiring standards which define the geometries and pin definitions for connectors. Changing the connector geometry and pin definitions would make systems cost prohibitive. The standards have created a large base of wiring and connectors, and a need for connectors capable of meeting the requirements of today's high speed transmission, while maintaining compatibility with the original connectors. The standard connector geometries and pin-outs are such that a great deal of crosstalk occurs at these higher signal transmission rates.

Connectors dealing with reduced crosstalk are disclosed in U.S. Pat. No. 5,432,484 to Klas et al, U.S. Pat. No. 4,414,393 to Rose et al, and U.S. Pat. No. 5,399,107 to Gentry, the subject matters of which are each hereby incorporated by reference.

SUMMARY OF THE INVENTION

An object of the present invention is to provide an interface panel which can convert fifty pin connectors to twelve modular jack patch panel ports, while maintaining 100 megabits per second throughput and without degrading the Category 5 performance.

Another object of the present invention is to provide a connection system for computer networks which is highly adaptable, is quick and simple to install and maintains high performance characteristics, even at high transmission rates.

A further object of the present invention is to employ twenty-five pair twisted cable assemblies for use in wiring network systems.

The foregoing objects are basically obtained by an interface panel for 100 megabits per second throughput network applications, comprising a plurality of modular jacks, at least one receptacle and a printed wiring board on which the modular jack and receptacle are mounted. Each modular jack has eight primary terminals. The receptacle has fifty secondary terminals. The wiring board has conductive paths printed thereon electrically connecting the respective primary terminals to the respective secondary terminals and canceling crosstalk.

By forming the interface in this manner, twelve modular jack ports can be provided for each fifty terminal receptacle. This facilitates connection to a network hub by the use of 25 pair unshielded twisted cables. The connection can be made by a simple plug in connection without concern for consistent workmanship or installer competency in handling a large number of wires. Additionally, significant labor savings are realized. Further, the crosstalk cancellation enables the high speed transmissions without degraded performance from crosstalk.

The foregoing objects are also obtained by a connection system for a computer network having a computer terminal with a terminal jack, a wall outlet with an outlet jack, a patch panel, an interface panel and a network hub. A first patch cord has a cable with plugs on opposite ends thereof connected to the terminal jack and to the outlet jack. The patch panel has a plurality of patch modular jacks, each of which having a plug jack and connection terminals. A first cable electrically connects the respective wiring and connection terminals. The interface panel has a plurality of interface modular jacks with primary terminals and at least one elongated receptacle with secondary terminals. The interface modular jack and elongated receptacle are mounted on a printed wiring board having conductive paths printed thereon electrically connecting the respective primary and secondary terminals and canceling crosstalk. A second patch cord has a cable with plugs on opposite ends thereof connecting the patch modular jacks to the interface modular jacks. The network hub has a network connector. A third patch cord has a cable with cord connectors on its opposite ends connected to the elongated receptacle and the hub connector.

By forming the connection system in this manner, the system can be easily manufactured and installed. Additionally, the crosstalk cancellation will enable Category 5 performance characteristics even at high transmission speeds of 100 Megabits per second.

Other objects, advantages and salient features of the present invention will become apparent from the following detailed description, which, taken in conjunction with the annexed drawings, discloses preferred embodiments of the present invention.

BRIEF DESCRIPTION OF THE DRAWINGS

Referring to the drawings which form a part of this disclosure:

FIGS. 8, 9 and 10 are each plan views of different layers of a printed wiring board for a connector according to the present invention.

DETAILED DESCRIPTION OF THE INVENTION

Figure 1:
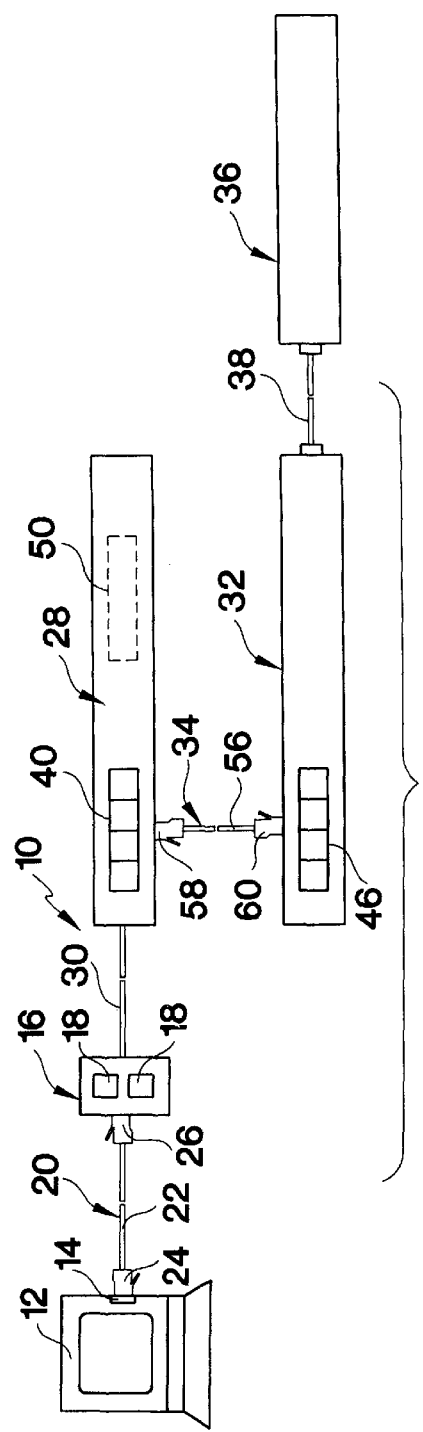
FIG. 1 is a schematic diagram of a connection system for a computer network according to the present invention.

Referring initially to FIG. 1, the connection system 10 for a computer network, particularly an Ethernet application, according to the present invention comprises a computer terminal 12 with a terminal jack 14 of conventional design. The computer terminal is connected to a wall outlet 16 having outlet jacks 18 with wiring terminals. Each outlet jack of the wall outlet is of conventional design, such as that disclosed in U.S. Pat. No. 5,399,107 to Gentry et al. A patch cord 20 connects the terminal jack and with one outlet jack. Patch cord 20 has a cable 22 and conventional modular plugs 24 and 26 (RJ45 plugs) on its opposite ends which are connected to the terminal jack and the outlet jack, respectively.

Outlet jacks 18 are connected to a patch panel 28 by a patch cable 30 of predetermined length. The patch panel 28 is connected to an interface panel 32 by a patch cord 34. The interface panel 32 is connected to a network hub 36 by a patch cord 38.

Figure 2:
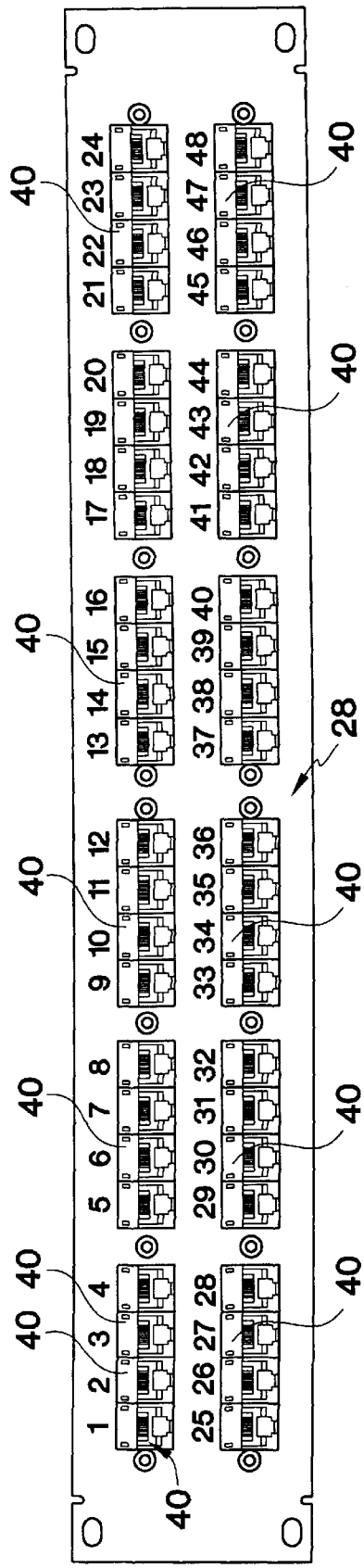
FIG. 2 is a front elevational view of the patch panel of the connection system of FIG. 1.

Patch panel 28 is of conventional design and comprises a plurality of modular jacks of the same type employed in wall outlet 16. As illustrated in FIG. 2, the patch panel has forty-eight modular jacks 40 arranged in two parallel rows and in groups of four each. Each modular jack is appropriately numbered for identification. Each modular jack of the patch panel has a plug jack with connection terminals. The terminals extend outwardly from the rear face of the patch panel with standard 110 termination contacts. Additionally, each terminal includes a circuit board for consistent and reliable electrical performance. The ends of cable 30 are terminated in the 110 contact terminations of the outlet jacks 18 and of the patch panel modular jacks.

Figure 3:
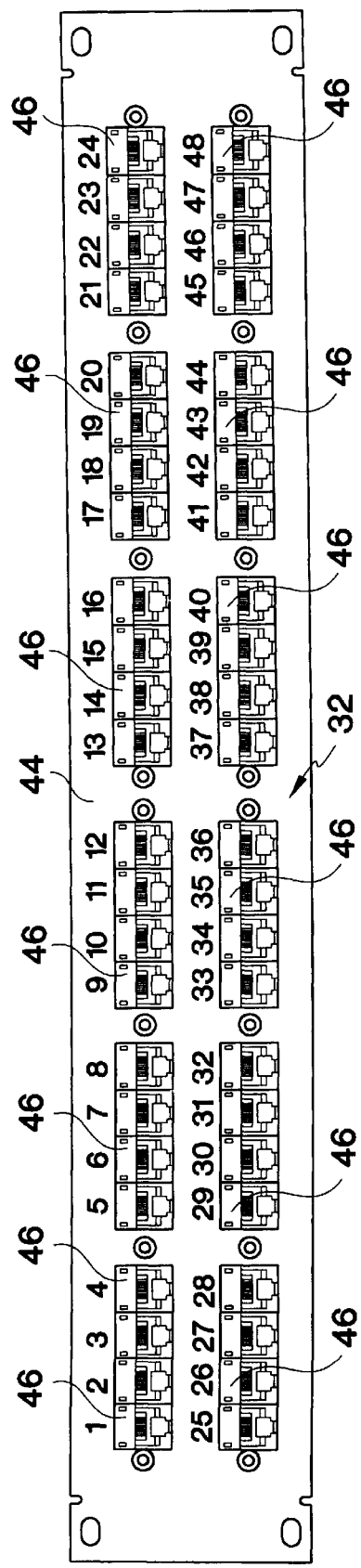
FIG. 3 is a front elevational view of the interface panel of the connection system of FIG. 1.
Figure 4:
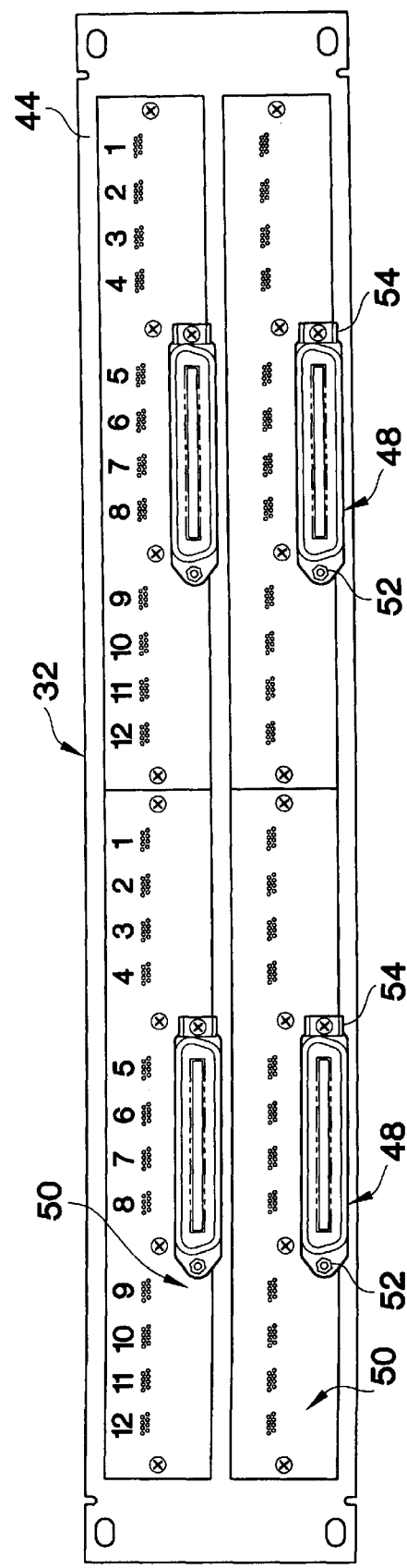
FIG. 4 is a rear elevational view of the interface panel for the connection system of FIG. 1.

The front and back of interface panel 32 are illustrated in FIGS. 3 and 4, respectively. The interface panel comprises a metallic support frame 44, a plurality of interface modular jacks 46, female interface receptacles 48 and multi-layered wiring boards 50 connecting the respective interface modular jacks and receptacles.

Each modular jack of the interface panel is of conventional design with Category 5 performance characteristics. Forty-eight modular jacks are provided and are arranged in two parallel rows in groups of four each. Each modular jack with its plug jack opening is identified by a port number as illustrated to facilitate connection.

Each receptacle 48 is coupled to a respective wiring board by screws 52. Each receptacle is provided with a wire tie mount 54. The elongated or RJ21 receptacles are of conventional design, having fifty secondary terminals arranged in pairs of 25 each in two parallel rows. Each receptacle is adapted to receive a standard fifty terminal elongated plug having its terminals arranged in two parallel rows to provide 25 pairs of terminals.

As illustrated in FIG. 4, four multi-layer wiring boards 50 are provided. Each wiring board connects twelve modular jacks 46, each having 8 primary terminals, to each single 25 pair receptacle 48 having 50 secondary terminals. Each circuit board is of the form illustrated and disclosed in the related application referred to on page 1 hereof. The circuit board 50 is formed of three separate layers 66 (FIG. 8), 67 (FIG. 9) and 68 (FIG. 10).

The first modular jack 48a has a first primary terminal 70, a second primary terminal 72, a third primary terminal 74 and a sixth primary terminal 76. These terminals are connected to the secondary interface or 25 pair connector of receptacle 48. The connector 48 has fifty terminals arranged in two parallel rows. The terminals of jack 48a are connected to secondary terminals 80, 82, 84 and 86. Specifically, first primary terminal 70 is connected to first secondary terminal 80 by conductive path 90. Second primary terminal 72 is connected to twenty-sixth secondary terminal 84 by conductive path 92. Third primary terminal 74 is connected to second secondary terminal 82 by conductive path 94. Sixth primary terminal 76 is connected to twenty-seventh secondary terminal 86 by conductive path 96. A first reactive coupling between first and third conductive paths 90 and 94 is provided by the close proximity of conductive paths 90 and 94 on layer 68. The second reactive coupling is provided by the section 98 on layer 68, formed as an addition to sixth conductive path 96 and extending independently from twenty-seventh secondary terminal 86. This section 96 extends close to and adjacent to first conductive path 90 to provide a reactive coupling therebetween.

To supplement the reactive coupling between the first and sixth conductive paths 90 and 96, respectively, layer 67 comprises conductive traces 100 and 102 extending from first secondary terminal 80 and twenty-seventh secondary conductive terminal 86, respectively. These conductive traces are in close proximity to provide a third reactive coupling therebetween.

Each of the conductive traces forming the third reactive coupling comprises a long segment and a plurality of short segments extending perpendicularly from the long segment. The long segments of the two traces are parallel. The short segments of the two segments are parallel to each other and are arranged in an alternating and interleaving manner to enhance the reactive coupling between the traces.

Similar arrangements are provided for connecting the first, second, third and sixth primary terminals of each of the twelve modular jacks to a set of four secondary terminals in receptacle 48. Minor variations are provided to facilitate spacing such as extension of the path section, corresponding to section 98 from the primary terminal of a jack rather than the secondary terminal of the receptacle.

In interface panel 32, for each fifty pin receptacle, the terminals in the receptacle and in the modular jacks for the twelve ports are connected as follows:

| Port | Female 50 pin | Jack Wiring | Female 50 pin | Port |
|------|---------------|-------------|---------------|------|
| 1    | 26            | 1           | 38            | 7    |
|      | 1             | 2           | 13            |      |
|      | 27            | 3           | 39            |      |
|      | 2             | 6           | 14            |      |
| 2    | 28            | 1           | 40            | 8    |
|      | 3             | 2           | 15            |      |
|      | 29            | 3           | 41            |      |
|      | 4             | 6           | 16            |      |
| 3    | 30            | 1           | 42            | 9    |
|      | 5             | 2           | 17            |      |
|      | 31            | 3           | 43            |      |
|      | 6             | 6           | 18            |      |
| 4    | 32            | 1           | 44            | 10   |
|      | 7             | 2           | 19            |      |
|      | 33            | 3           | 45            |      |
|      | 8             | 6           | 20            |      |
| 5    | 34            | 1           | 46            | 11   |
|      | 7             | 2           | 21            |      |
|      | 35            | 3           | 47            |      |
|      | 10            | 6           | 22            |      |
| 6    | 36            | 1           | 48            | 12   |
|      | 11            | 2           | 23            |      |
|      | 37            | 3           | 49            |      |
|      | 12            | 6           | 24            |      |

Patch panel 28 is electrically connected to interface panel 32 by a plurality of patch cords 34 (FIG. 1). Each patch cord 34 a cable 56 with conventional RJ45 modular plugs 58 and 60 at the opposite ends of the cable. A plurality of patch cords 34 are employed to connect the patch and interface panels. Each patch cord has its plug 58 within the respective modular jack port of the patch panel 28 and its plug 60 inserted within the respective interface panel jack port.

Figure 5:
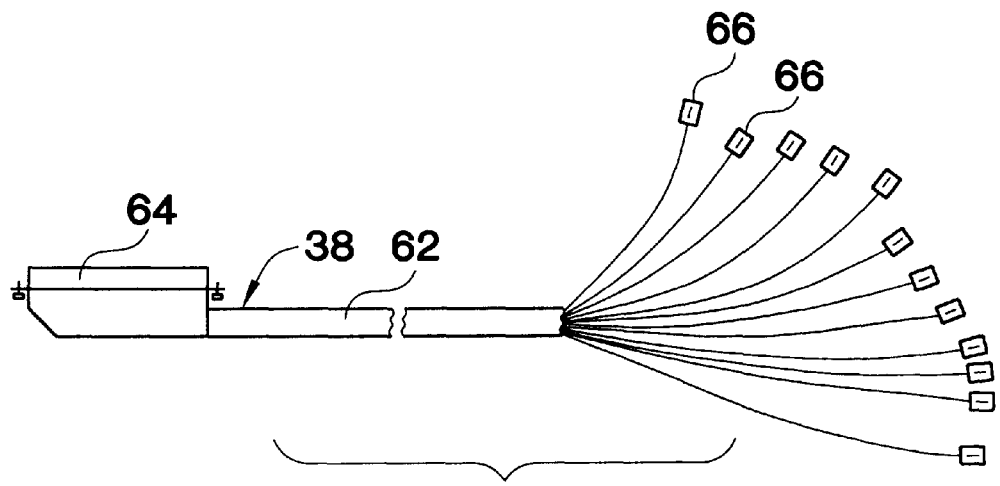
FIG. 5 is a side elevational view of a patch cord for connecting the interface panel to the network hub for the connection system of FIG. 1, according to a first embodiment of the present invention.
Figure 6:
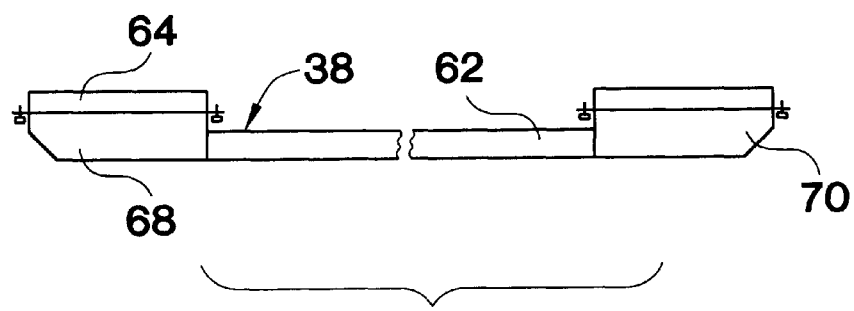
FIG. 6 is a side elevational view of a patch cord for connecting the interface panel to the network hub of the connection system of FIG. 1, according to a second embodiment of the present invention.
Figure 7:
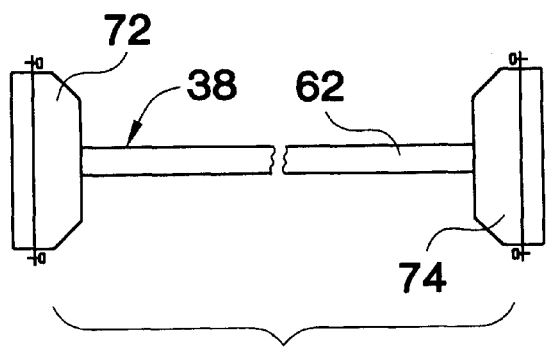
FIG. 7 is a side elevational view of a patch cord for connecting the interface panel to the network hub of the connection system of FIG. 1, according to a third embodiment of the present invention.

Network hub 36 can have a variety of different designs. To enable the interface panel 32 to be connected to network hub 36, patch cord 38 can have different forms or arrangements. These different forms are illustrated in FIGS. 5–7. In the embodiment of FIG. 5, patch cord 38, comprises a cable 62 having 25 pairs of twisted, unshielded conductors providing Category 5 performance, with a elongated 25 pair plug 64 at one end and a plurality of modular plugs 66 connected to respective groups of cable conductors at its opposite end. The patch cord of FIG. 5 is used when the network hub has RJ45 ports on its front. The connection is thereby provided by locating the modular plugs 66 within the respective RJ45 ports on the network hub.

Patch cord 38 of FIG. 6 has a cable 62 with two elongated plugs 68 and 70 located at its opposite ends. Plugs 68 and 70 are similar to the plug 64 and face in a direction perpendicular to the longitudinal axis of cable 62.

The patch cord 38 of FIG. 7 has a cable 62 with elongated 25 pair plugs 72 and 74 located on its opposite ends. Plugs 72 and 74 face in opposite directions relative to the longitudinal axis of cable 62. Such arrangement is particularly well suited for high density equipment.

The embodiments of FIGS. 6 and 7 are suitable for hubs having fifty terminal receptacles, and provide a simple and quick installment procedure.

While various embodiments have been chosen to illustrate the invention, it will be understood by those skilled in the art that various changes and modifications can be made therein, without departing from the scope of the invention as defined in the appended claims.

What is claimed is:

1. A connection system for a computer network, comprising:

at least one computer terminal with a terminal jack;

a wall outlet having an outlet jack with wiring terminals;

a first patch cord having a cable with plugs on opposite ends thereof connected to said terminal jack and said outlet jack;

a patch panel having a plurality of patch modular jacks, each of said patch modular jacks having a plug jack and connection terminals;

a first cable electrically connecting the respective wiring and connection terminals;

an interface panel having a plurality of interface modular jacks with primary terminals and at least one elongated receptacle mounted on a printed wiring board, said wiring board having conductive paths printed thereon electrically connecting the respective primary and secondary terminals, said conductive paths having lengths, widths and spacings for canceling crosstalk induced at said terminals coupled thereby;

a second patch cord having a cable with plugs on opposite ends thereof connecting said patch modular jacks to said interface modular jacks;

a network hub having at least one hub connector; and a third patch cord having a cable with cord connectors on opposite ends thereof connected to said elongated receptacle and said hub connection.

2. A connection system according to claim 1 wherein said patch cords and said panels satisfy Category 5 performance standards.

3. A connection system according to claim 1 wherein said elongated receptacle comprise fifty terminals arranged in two parallel rows.

4. A connection system according to claim 1 wherein said cord connectors of said third patch cord comprise elongated cord plugs, each with fifty terminals arranged in two parallel rows.

5. A connection system according to claim 4 wherein said cord plugs face in opposite directions relative to a longitudinal axis of said cable of said fourth patch cord.

6. A connection system according to claim 4 wherein said cord plugs face in a direction perpendicular to a longitudinal axis of said cable of said fourth patch cord.

7. A connection system according to claim 1 wherein one of said cord connectors on a first end of said third patch cord is an elongated cord plug with fifty terminals arranged in two parallel rows; and said cord connector on a second end of said patch cord comprises a plurality of modular plugs.

8. A connection system according to claim 1 wherein said interface panel comprises at least a first set of twelve of said interface modular jacks, each of said interface modular jacks of said first set having first, second, third, fourth, fifth, sixth, seventh and eight primary terminals arranged in order;

said elongated receptacle has fifty secondary terminals; and said conductive paths connect said first second, third and sixth primary terminals of each of said twelve interface modular jacks of said first set to the respective secondary terminals of said elongated receptacle.

\* \* \* \* \*